(12) United States Patent
Tryon et al.

(10) Patent No.: US 8,641,963 B2
(45) Date of Patent: Feb. 4, 2014

(54) ECONOMIC OXIDATION AND FATIGUE RESISTANT METALLIC COATING

(75) Inventors: Brian S. Tryon, Glastonbury, CT (US); David A. Litton, West Hartford, CT (US); Russell A. Beers, Manchester, CT (US)

(73) Assignee: United Technologies Corporation, Hartford, CT (US)

( * ) Notice: Subject to any disclaimer, the term of this patent is extended or adjusted under 35 U.S.C. 154(b) by 917 days.

(21) Appl. No.: 12/168,949

(22) Filed: Jul. 8, 2008

(65) Prior Publication Data

US 2010/0009092 A1 Jan. 14, 2010

(51) Int. Cl.
| | | |
|---|---|---|
| *C22C 19/05* | (2006.01) | |
| *C09K 3/00* | (2006.01) | |
| *B32B 15/01* | (2006.01) | |
| *C23C 4/08* | (2006.01) | |

(52) U.S. Cl.
USPC ........ 420/444; 106/14.05; 428/678; 427/456; 427/405

(58) Field of Classification Search
USPC ................ 420/444, 456; 428/678; 106/14.05; 427/456, 405
See application file for complete search history.

(56) References Cited

U.S. PATENT DOCUMENTS

| | | | |
|---|---|---|---|
| 4,346,137 A | | 8/1982 | Hecht |
| 4,451,431 A | * | 5/1984 | Naik .............................. 420/588 |
| 4,615,864 A | * | 10/1986 | Dardi et al. .................... 420/437 |
| 5,077,141 A | | 12/1991 | Naik et al. |
| 5,316,866 A | | 5/1994 | Goldman et al. |
| 5,514,482 A | | 5/1996 | Strangman |
| 5,561,827 A | | 10/1996 | Reeves et al. |
| 6,582,772 B2 | | 6/2003 | Rigney et al. |
| 6,919,042 B2 | | 7/2005 | Beers et al. |
| 7,214,409 B1 | | 5/2007 | Kasule |
| 7,264,887 B2 | | 9/2007 | Khan et al. |
| 7,316,850 B2 | | 1/2008 | Hu et al. |
| 7,361,302 B2 | | 4/2008 | Beers et al. |
| 2002/0192494 A1 | * | 12/2002 | Tzatzov et al. ............... 428/655 |
| 2006/0141283 A1 | * | 6/2006 | Madhava ...................... 428/651 |

FOREIGN PATENT DOCUMENTS

| | | |
|---|---|---|
| JP | 10168534 A | 6/1998 |
| WO | 2006/025865 A2 | 3/2006 |

OTHER PUBLICATIONS

European Search Report for EP 09250239.2 dated Jul. 21, 2009.

* cited by examiner

*Primary Examiner* — Jessee Roe
(74) *Attorney, Agent, or Firm* — Bachman & LaPointe, P.C.

(57) ABSTRACT

The present disclosure relates to an improved low-cost metallic coating to be deposited on gas turbine engine components. The metallic coating consists of 1.0 to 18 wt % cobalt, 3.0 to 18 wt % chromium, 5.0 to 15 wt % aluminum, 0.01 to wt % yttrium, 0.01 to 0.6 wt % hafnium, 0.0 to 0.3 wt % silicon, 0.0 to 1.0 wt % zirconium, 0.0 to 10 wt % tantalum, 0.0 to 9.0 wt % tungsten, 0.0 to 10 wt % molybdenum, 0.0 to 43.0 wt % platinum, and the balance nickel.

13 Claims, 1 Drawing Sheet

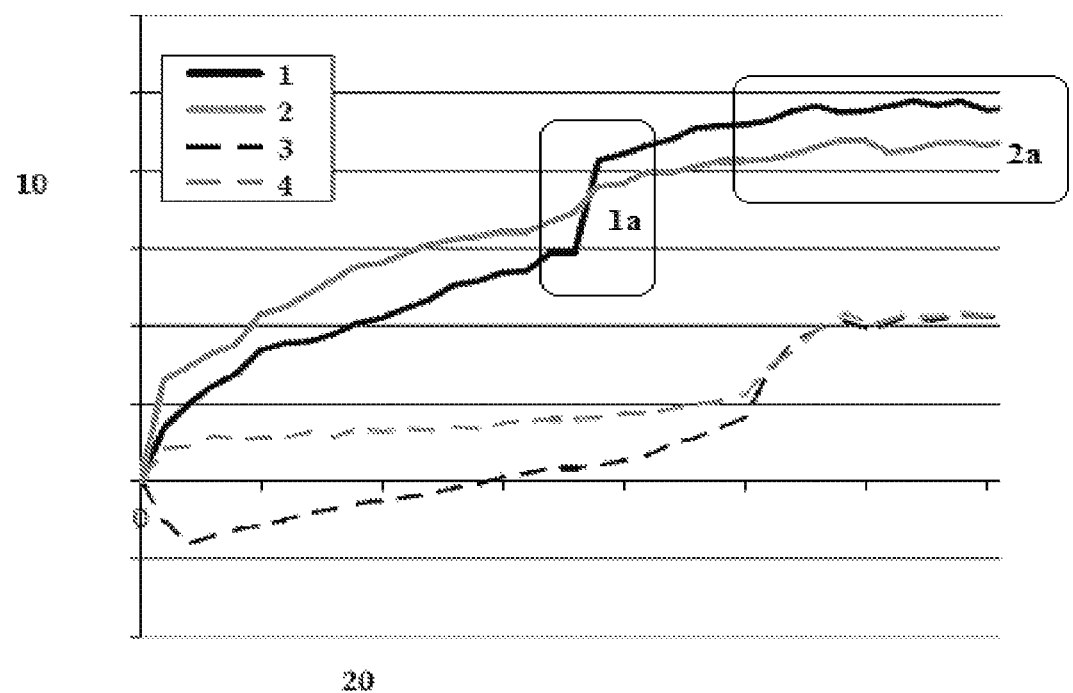

ns of the present disclosure are contained within U.S. Pat. No. 6,919,042 which is hereby expressly incorporated by reference in its entirety. The present disclosure particularly relates to an improved oxidation and fatigue resistant metallic coating for protecting high temperature gas turbine engine components.

ECONOMIC OXIDATION AND FATIGUE RESISTANT METALLIC COATING

GOVERNMENT RIGHTS

The United States Government may have certain rights in the invention pursuant to contract number N00014-07-C-0503 awarded by the United States Navy.

BACKGROUND

Portions of the present disclosure are contained within U.S. Pat. No. 6,919,042 which is hereby expressly incorporated by reference in its entirety. The present disclosure particularly relates to an improved oxidation and fatigue resistant metallic coating for protecting high temperature gas turbine engine components.

Various metallic coatings have been developed in the past for the oxidation protection of high temperature gas turbine engine components. These coatings are often based on different aluminide compositions, and may include nickel or cobalt base metal materials. Alternatively, they are based on overlay deposits with MCrAlY foundations where M is nickel, cobalt, iron or combinations of these materials. These coating systems suffer from shortcomings that preclude their use on newer advanced turbine components. The diffused aluminides, while possessing good fatigue resistance, generally provide lower high temperature oxidation resistance (above 2000 degrees Fahrenheit). The overlay MCrAlY coatings tend to have tensile internal stress, which can promote cracking and reduces the fatigue life of the coating (i.e. creates fatigue debt). The addition of active elements to the MCrAlY coatings not only provides excellent oxidation resistance, but makes them good candidates for bond-coats for thermal barrier coatings.

Thermal barrier coating systems (TBCs) provide a means to protect the turbine engine components from the highest temperatures in the engine. Before a TBCs is applied, metallic bond coats, such as aluminides or MCrAlY coatings, are deposited on the surface of the turbine engine component, and a thermally grown oxide of alumina is grown between the bond coat and the TBCs topcoat.

As superalloy technology advances, the economics and material trade-offs involved in creating creep resistant higher refractory-containing super alloys have become of interest. While both aluminides and MCrAlY coatings have widespread applications, a low-cost improved coating that could combine the best properties from both would have immediate application on advanced turbine components where fatigue, pull weight, and oxidation must all be minimized.

SUMMARY

The present disclosure provides a low cost coating composition which reduces the thermal expansion mismatch between the coating and common turbine alloys over current coatings.

The present disclosure still further provides a coating composition without refractory metals.

In accordance with the present disclosure, a metallic coating is provided which has a composition consisting of 1.0 to 18 wt % cobalt, 3.0 to 18 wt % chromium, 5.0 to 15 wt % aluminum, 0.01 to 1.0 wt % yttrium, 0.01 to 0.6 wt % hafnium, 0.0 to 0.3 wt % silicon, 0.0 to 1.0 wt % zirconium, 0.0 to 10 wt % tantalum, 0.0 to 9.0 wt % tungsten, 0.0 to 10 wt % molybdenum, 0.0 to 43.0 wt % platinum, and the balance nickel.

Other details of the oxidation and fatigue resistant metallic coatings of the present disclosure, as well as other embodiments attendant thereto, are set forth in the following detailed description.

BRIEF DESCRIPTION OF THE DRAWING

FIG. 1 charts the oxide growth kinetics of the first family of coatings and third family of coatings described in detail below.

DETAILED DESCRIPTION

Turbine engine components are formed from nickel-based, cobalt-based, and iron-based alloys. Due to the extreme high temperature environments in which these components are used, it is necessary to provide them with a protective coating. Metallic bond coatings must have a composition which minimizes the fatigue impact on the turbine engine components to which they are applied and at the same time provides maximum oxidation resistance properties. The coating must also be one where the thermal expansion mismatch between the coating and the alloy(s) used to form the turbine engine components is minimized. This mismatch is a cause of fatigue performance of MCrAlY coatings.

In accordance with the present disclosure, low-cost metallic coatings have been developed which reduce the thermal mismatch and which provide a good oxidation and fatigue resistance. The coatings can be used as stand-alone bond coat or as a bond coat used within a TBC system. These metallic coatings have a composition which broadly consists of 1.0 to 18 wt % cobalt, 3.0 to 18 wt % chromium, 5.0 to 15 wt % aluminum, 0.01 to 1.0 wt % yttrium, 0.01 to 0.6 wt % hafnium, 0.0 to 0.3 wt % silicon, 0.0 to 1.0 wt % zirconium, 0.0 to 10 wt % tantalum, 0.0 to 9.0 wt % tungsten, 0.0 to 10 wt % molybdenum, 0.0 to 43.0 wt % platinum, and the balance nickel.

Within the foregoing broad scope of coating compositions, a first family of particularly useful coatings for turbine engine components has a composition which consists of 1.0 to 15 wt %, for example 10.0 wt % cobalt, 5.0 to 18 wt %, for example 5.0 wt % chromium, 5.0 to 12 wt %, for example 11.0 wt % aluminum, 0.01 to 1.0 wt %, for example 0.6 wt % yttrium, 0.01 to 0.6 wt %, for example 0.6 wt % hafnium, 0.0 to 0.3 wt %, for example 0.2 wt % silicon, 0.0 to 1.0 wt %, for example 0.1 wt % zirconium, 3.0 to 10 wt %, for example 3.0 to 6.0 wt % tantalum, 0.0 to 5.0 wt %, for example 2.5 to 5.0 wt % tungsten, 0.0 to 10 wt %, for example 2.0 wt % or less molybdenum, and the balance nickel. The total combined amount of tantalum and tungsten in these metallic coatings is in the range of 3.0 to 12 wt % and for example in the range of 5.5 to 11.0 wt %.

Within this first family of coatings, a particularly useful coating composition consists of 10.0 wt % cobalt, 5.0 wt % chromium, 11.0 wt % aluminum, 0.6 wt % yttrium, 0.6 wt % hafnium, 0.2 wt % silicon, 0.1 wt % zirconium, 3.0 to 6.0 wt % tantalum, 2.5 to 5.0 wt % tungsten, 0.8 to 1.7 wt % molybdenum, and the balance nickel.

For somewhat slower oxidation kinetics, a second family of particularly useful metallic coating compositions comprises 1.0 to 15 wt %, for instance 10.0 wt % cobalt, 5.0 to 18 wt %, for instance 5.0 wt % chromium, 5.0 to 12 wt %, for instance 11.0 wt % aluminum, 0.01 to 1.0 wt %, for example 0.6 wt % yttrium, 0.01 to 0.6 wt %, for example 0.6 wt % hafnium, 0.0 to 0.3 wt %, for example 0.2 wt % silicon, 0.0 to 1.0 wt %, for example 0.1 wt % zirconium, and the balance nickel. This second family of metallic coating may also contain 0.0 to 43.0% platinum and is devoid of all refractory metals, i.e. tungsten, molybdenum, tantalum, niobium and rhenium. These refractory elements are known to provide strength to superalloy materials; however, they are not known to possess oxidation resistant properties, they are expensive and at higher levels they promote topologically close packed phases.

Within this second family of coatings, a particularly useful coating composition consists of about 10.0 wt % cobalt, 5.0 wt % chromium, 11.0 wt % aluminum, 0.6 wt % yttrium, 0.6 wt % hafnium, 0.2 wt % silicon, 0.1 wt % zirconium, and the balance nickel.

A third family of particularly useful coatings for turbine engine components has a composition which consists of 1.0 to up to about 15 wt %, for example 10.0 wt % cobalt, 5.0 to 18 wt %, for example 5.0 wt % chromium, 5.0 to 12 wt %, for example 11.0 wt % aluminum, 0.01 to 1.0 wt %, for example 0.6 wt % yttrium, 0.01 to 0.6 wt %, for example 0.6 wt % hafnium, 0.0 to 0.3 wt %, for example 0.2 wt % silicon, 0.0 to 1.0 wt %, for example 0.1 wt % zirconium, 3.0 to 10 wt %, for example 3.0 to 6.0 wt % tantalum, 0.0 to 5.0 wt %, for example 2.5 to 5.0 wt % tungsten, 0.0 to 10 wt %, for example 2.0 wt % or less molybdenum, 10.0 to 43.0 wt %, for example 23.0 to 27.0 wt % platinum and the balance nickel. The total combined amount of tantalum and tungsten in these metallic coatings is in the range of 3.0 to 12 wt % and for example in the range of 5.5 to 11.0 wt %.

Within this third family of coatings, a particularly useful coating composition consists of 8.0 wt % cobalt, 4.0 wt % chromium, 9.0 wt % aluminum, 5.0 wt % tantalum, 1.0 wt % molybdenum, 4.0 wt % tungsten, 0.6 wt % yttrium, 0.6 wt % hafnium, 0.2 wt % silicon, 0.1 wt % zirconium, and about 23.0 to about 27.0 wt % platinum.

FIG. 1 charts the weight gain per surface area of the first family of coatings 2 and the third family of coatings 4 as they compare to the Re-containing coating of U.S. Pat. No. 6,919,042 2 and the U.S. Pat. No. 6,919,042 Re-containing coating with platinum 3. The oxide growth is measured by weight gain per surface area ($\Delta m/A_s$ ($mg/cm^2$)) 10 on the y-axis versus the number of 60 minute cycles 20 on the x-axis. The 60 minute cycles are hot/cold cycles consisting of 52 minutes at a temperature of about 2085° F. to 2115° F. and 8 minutes cooling to a temperature of approximately 212° F. The oxide growth kinetics are measured as a function of time. Slower weight gain results in better oxide growth, i.e. oxidation kinetics.

U.S. Pat. No. 6,919,042 Re containing coating 1, FIG. 1 displays parabolic mass gain/surface area for the initial stages of oxidation; however, following additional exposure, e.g., greater than nominally 350 cycles at 2100° F. Region 1a, the oxidation behavior of the composition experiences a large mass gain. Compared with coating 2, a non-Re containing embodiment from the first family of coatings, the mass gain/surface area with time is much more uniform with little deviation from its parabolic features. Further, at exposures greater than 400 cycles Region 2a, the predominately parallel curves of coating 1 and coating 2 shows that the oxidation rates are similar; however, the mass gain of coating 2 appears kinetically more favorable than coating 1.

In FIG. 1, the Pt-containing embodiments of the present invention, 3 and 4, exhibit slower oxidation kinetics than their non-Pt containing counterparts, and thus, appear more favorable from a long term oxidation resistance point of view. The Re-containing coating according to U.S. Pat. No. 6,919,042, with platinum 3, shows an initial mass loss. The initial mass loss is suspected to be due to the Pt plating process, e.g. some of the Pt was not fully adhered. As compared to coating with platinum 4, Re-containing coating 3 gains weight at a faster rate. While the oxidation behavior at the onset of testing is not straightforward, it was observed that the overall oxidation rate is quite favorable.

A driver of poor coating fatigue performance is excessive coating thickness. Coatings with the aforesaid compositions may have a thickness of 1 to 10 mils (0.001 to 0.01 inch), for example 1 to 2 mils (0.001 to 0.002 inch). Typical methods of depositing overlay coatings include thermal spray techniques such as low pressure plasma spray (LPSS), which creates coating thicknesses in the range of 4 to 12 mils (0.004 to 0.012 inch). Using cathodic arc plasma vapor deposition techniques, it is possible to apply coatings with the aforesaid compositions having a thickness of 2 mils (0.002 inch) or thinner. Techniques for applying the coatings of the present disclosure by cathodic arc plasma vapor deposition are discussed in U.S. Pat. Nos. 5,972,185; 5,932,078; 6,036,828; 5,792,267; and 6,224,726, all of which are incorporated by reference herein. Alternate methods of deposition, including other plasma vapor deposition techniques such as magnetron sputtering and electron beam plasma vapor deposition may be used. When thickness concerns are not present, various thermal spray techniques such as low pressure plasma spray and HVOF (high velocity oxy-fuel) techniques may be utilized.

For example, the third family of coatings containing Pt may be deposited by various coating methods, such as the coating methods detailed above, various coating methods within the art and/or additional methods. For instance, it is possible to deposit the Pt after the non-Pt portion of the coating is deposited via a cathodic arc plasma technique or a LPPS technique. In this coating example, the Pt is deposited over the top of the pre-deposited coating via plating, EB-PVD, sputtering or some other physical vapor deposition (PVD) method. The Pt is then diffused into the coating. The Pt may also be deposited prior to the non-Pt PVD coating process. In this instance, the bond coat is deposited on top of the Pt interlayer and then subjected to a diffusion heat treatment. Alternatively, Pt may be incorporated into the coating source material and deposited via conventional aforementioned PVD methods.

It is apparent that there has been provided in accordance with the present disclosure a low-cost oxidation and fatigue resistant metallic coating which fully satisfies the embodiments set forth hereinbefore. While the present disclosure has been described in the context of specific coatings thereof, other alternatives, modifications, and variations will become apparent to those skilled in the art having read the foregoing description. Accordingly, it is intended to embrace those alternatives, modifications, and variations as they fall within the broad scope of the appended claims.

What is claimed is:

1. A metallic coating for providing oxidation and fatigue resistance having a composition consisting of 1.0 to 18 wt % cobalt, 3.0 to 18 wt % chromium, 5.0 to 15 wt % aluminum, 0.01 to 1.0 wt % yttrium, 0.01 to 0.6 wt % hafnium, 0.0 to 0.3 wt % silicon, 0.1 to 1.0 wt % zirconium, 0.0 to 10 wt % tantalum, 2.5-5.0 wt % tungsten, 0.0 to 10 wt % molybdenum, 23.0 to 27.0 wt % platinum, and the balance nickel.

2. A metallic coating according to claim 1, wherein the cobalt is present in an amount of 1.0 to 15 wt %.

3. A metallic coating according to claim 1, wherein the chromium is present in an amount from 5.0 to 18 wt %.

4. A metallic coating according to claim 1, wherein the aluminum is present in an amount from 5.0 to 12 wt %.

5. A metallic coating according to claim 1, wherein the tantalum is present in an amount of 3.0 to 10.0 wt %.

6. A metallic coating according to claim 1, wherein a total amount of the tantalum and the tungsten is in a range from 3.0 to 12.0 wt %.

7. A metallic coating according to claim 1, wherein the composition consists of 1.0 to 15 wt % cobalt, 5.0 to 18 wt % chromium, 5.0 to 12 wt % aluminum, 0.01 to 1.0 wt % yttrium, 0.01 to 0.6 wt % hafnium, about 0.2 wt % silicon, 1.0 wt % zirconium, 3.0 to 10 wt % tantalum, 2.5 to 5.0 wt % tungsten, 0.8 to 1.7 wt % molybdenum, and the balance nickel.

8. A metallic coating according to claim 1, wherein the composition consists of 1.0 to 15 wt % cobalt, 5.0 to 18 wt % chromium, 5.0 to 12 wt % aluminum, 0.01 to 1.0 wt % yttrium, 0.01 to 0.6 wt % hafnium, about 0.2 wt % silicon, 0.1 wt % zirconium, 23.0 to 27.0% platinum and the balance nickel.

9. A metallic coating according to claim 1, wherein the composition consists of 1.0 to up to about 15 wt % cobalt, 5.0 to 18 wt % chromium, 5.0 to 12 wt % aluminum, 0.01 to 1.0 wt % yttrium, 0.01 to 0.6 wt % hafnium, 0.0 to 0.3 wt % silicon, 0.1 to 1.0 wt % zirconium, 3.0 to 10 wt % tantalum, 2.5 to 5.0 wt % tungsten, up to about 2.0 wt % molybdenum, 23.0 to 27.0 wt % platinum and the balance nickel.

10. A metallic coating for providing oxidation and fatigue resistance having a composition consisting of 1.0 to 18 wt % cobalt, 3.0 to 18 wt % chromium, 5.0 to 15 wt % aluminum, 0.01 to 1.0 wt % yttrium, 0.01 to 0.6 wt % hafnium, 0.0 to 0.3 wt % silicon, 0.1 to 1.0 wt % zirconium, 0.0 to 10 wt % tantalum, 0.0 to 9.0 wt % tungsten, 0.8 to 1.7 wt % molybdenum, 23.0 to 27.0 wt % platinum, and the balance nickel.

11. A metallic coating for providing oxidation and fatigue resistance having a composition consisting of 8.0 to 10.0 wt % cobalt, 4.0 to 5.0 wt % chromium, 9.0 to 11.9 wt % aluminum, 0.6 wt % yttrium, 0.6 wt % hafnium, 0.2 wt % silicon, 0.1 wt % zirconium, 0.0 to 10 wt % tantalum, 0.0 to 9.0 wt % tungsten, 0.0 to 10 wt % molybdenum, 23.0 to 27.0 wt % platinum, and the balance nickel.

12. A metallic coating for providing oxidation and fatigue resistance having a composition consisting of 1.0 to 15 wt % cobalt, 5.0 to 18 wt % chromium, 5.0 to 12 wt % aluminum, 0.01 to 1.0 wt % yttrium, 0.01 to 0.6 wt % hafnium, about 0.2 wt % silicon, 0.1 wt % zirconium, 3.0 to 10 wt % tantalum, 2.5 to 5.0 wt % tungsten, 0.8 to 1.7 wt % molybdenum, and the balance nickel.

13. A metallic coating according to claim 12, wherein a total amount of the tantalum and the tungsten is in a range from 5.5 to 11.0 wt %.

\* \* \* \* \*